(12) United States Patent
Salit et al.

(10) Patent No.: US 9,857,441 B2
(45) Date of Patent: Jan. 2, 2018

(54) SINGLE BEAM RADIO FREQUENCY ATOMIC MAGNETOMETER

(71) Applicant: Honeywell International Inc., Morristown, NJ (US)

(72) Inventors: Mary K. Salit, Plymouth, MN (US); Kenneth Salit, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 1232 days.

(21) Appl. No.: 13/922,376

(22) Filed: Jun. 20, 2013

(65) Prior Publication Data
US 2014/0375313 A1 Dec. 25, 2014

(51) Int. Cl.
  *G01V 3/00* (2006.01)
  *G01R 33/26* (2006.01)
  *G01R 33/032* (2006.01)

(52) U.S. Cl.
  CPC .......... *G01R 33/26* (2013.01); *G01R 33/032* (2013.01)

(58) Field of Classification Search
  CPC ..................................... G01R 33/26
  USPC ....................... 324/304, 302, 301
  See application file for complete search history.

(56) References Cited

U.S. PATENT DOCUMENTS

| | | | |
|---|---|---|---|
| 7,038,450 B2 | 5/2006 | Romalis et al. | |
| 7,102,451 B2 | 9/2006 | Happer et al. | |
| 7,521,928 B2 | 4/2009 | Romalis et al. | |
| 7,872,473 B2 | 1/2011 | Kitching et al. | |
| 7,994,783 B2 | 8/2011 | Ledbetter et al. | |
| 8,044,663 B2 | 10/2011 | Kim et al. | |
| 8,212,556 B1 | 7/2012 | Schwindt et al. | |
| 8,305,078 B2 | 11/2012 | Savukov et al. | |
| 9,541,398 B2 * | 1/2017 | Overstreet, II | G01C 19/62 |
| 2005/0052650 A1 | 3/2005 | Wu | |
| 2010/0090697 A1 | 4/2010 | Savukov et al. | |
| 2010/0289491 A1 | 11/2010 | Budker et al. | |
| 2011/0031969 A1 | 2/2011 | Kitching et al. | |
| 2013/0015850 A1 | 1/2013 | Lindorfer et al. | |

(Continued)

OTHER PUBLICATIONS

European Patent Office, "EPO Communication under Rule 71(3) EPC from EP Application No. 14171859.3", "from Foreign Counterpart of U.S. Appl. No. 13/922,376", dated Jun. 1, 2016, pp. 146, Published in: EP.

(Continued)

*Primary Examiner* — Louis Arana
(74) *Attorney, Agent, or Firm* — Fogg & Powers LLC

(57) ABSTRACT

A radio-frequency atomic magnetometer comprises a laser, a photodetector, a vapor chamber, wherein the vapor chamber is in an optical path of laser light between the laser and photodetector, a circular polarizer configured to circularly polarize laser light emitted by the laser, wherein a circularly polarized laser beam is configured to pump into an oriented state, spins of atoms in the vapor chamber and to probe the atoms of the vapor chamber, wherein probing includes detecting a local radio frequency field; and a set of direct current (DC) field coils comprising at least one DC field coil, wherein the set of DC field coils is configured to generate a DC magnetic field oriented at 45 degrees relative to the optical axis of the laser light emitted by the laser and directed toward the vapor chamber; the set of DC field coils further configured to have adjustable DC magnetic field strength.

20 Claims, 4 Drawing Sheets

(56) References Cited

U.S. PATENT DOCUMENTS

| | | |
|---|---|---|
| 2013/0027041 A1 | 1/2013 | Savukov et al. |
| 2013/0043956 A1 | 2/2013 | Salit et al. |
| 2016/0313417 A1* | 10/2016 | Kawabata ............... G01R 33/26 |
| 2017/0023654 A1* | 1/2017 | Kobayashi ............. G01R 33/26 |

OTHER PUBLICATIONS

European Patent Office, "Extended European Search Report for Application U.S. Appl. No. 14171859.3", "from Foreign Counterpart to Serial No. 13/922,376", dated Mar. 3, 2015, pp. 115, Published in: EP.

Bevilacqua et al., "All-Optical Magnetometry for NMR Detection in a Micro-Tesla Field and Unshielded Environment", "Journal of Magnetic Resonance", 2009, pp. 222-229, Published in: Siena, Italy.

Jimenez-Martinez et al., "Sensitivity Comparison of Mx and Frequency-Modulated Bell-Bloom Cs Magnetometers in a Microfabricated Cell", "IEEE Transactions on Instrumentation and Measurement", Feb. 2010, pp. 1-7, vol. 59, No. 2, Publisher: IEEE.

Kamada et al., "Human MCG Measurements with a High-Sensitivity Potassium Atomic Magnetometer", "Physiological Measurement", 2012, pp. 1063-1071.

Savukov et al., "Detection of NMR Signals with a Radio-Frequency Atomic Magnetometer", "Journal of Magnetic Resonance", 2007, pp. 214-220.

Lee et al., "Subfemtotesla Radio-Frequency Atomic Magnetometer for Detection of Nuclear Quadrupole Resonance", "Appliec Physics Letters 89", Nov. 2006, pp. 1-3.

Schwindt et al., "Chip-Scale Atomic Magnetometer with Improved Sensitivity by use of the Mx Technique", "Applied Physics Letters 90", Feb. 2007, pp. 1-3.

* cited by examiner

SINGLE BEAM RADIO FREQUENCY ATOMIC MAGNETOMETER

BACKGROUND

Low Field Nuclear Magnetic Resonance (LF-NMR) and zero-field NMR, also known as Nuclear Quadrupole Resonance, are used for detecting and characterizing materials using radio frequency (RF) spectroscopy, as well as for imaging applications such as magnetic resonance imaging (MRI). Typically, low field and zero field measurements have lower signal to noise levels than are achievable in traditional, high field NMR and MRI, but can be used to detect different properties, including some which have security applications, such as the spectroscopic fingerprints of different explosives, and potentially some nuclear and biological materials as well. In addition, the low-field techniques eliminate the need for large superconducting magnets as in traditional high field NMR and MRI. This allows low-field and zero-field NMR systems potentially to be more portable, miniaturizable, and lower power.

Atomic magnetometers have been shown in previously published work to offer a signal to noise advantage in detecting RF fields over pick-up coils at frequencies below 5 megahertz (MHz). They also offer an advantage in terms of portability and expense over other detector alternatives, such as Superconducting Quantum Interference Device (SQUID) magnetometers, which require cryogenic cooling. However, existing RF-sensitive atomic magnetometers are still relatively bulky devices, and the geometry of the interactions between the laser fields and the atomic vapor limits prospects for miniaturization. For applications in which size, weight, and power are restricted, neither existing atomic magnetometers nor SQUIDS provide an adequate solution.

SUMMARY

In one embodiment, a radio-frequency atomic magnetometer is provided. The radio-frequency magnetometer comprises a laser, a photodetector, a vapor chamber, wherein the vapor chamber is in an optical path of laser light between the laser and photodetector, a circular polarizer configured to circularly polarize laser light emitted by the laser, wherein a circularly polarized laser beam is configured to pump into an oriented state, spins of atoms in the vapor chamber and to probe the atoms of the vapor chamber, wherein probing includes detecting a local radio frequency field; and a set of direct current (DC) field coils comprising at least one DC field coil, wherein the set of DC field coils is configured to generate a DC magnetic field oriented at 45 degrees relative to the optical axis of the laser light emitted by the laser and directed toward the vapor chamber; the set of DC field coils further configured to have adjustable DC magnetic field strength.

DRAWINGS

Understanding that the drawings depict only exemplary embodiments and are not therefore to be considered limiting in scope, the exemplary embodiments will be described with additional specificity and detail through the use of the accompanying drawings, in which.

DETAILED DESCRIPTION

Part of the reason for the poor signal to noise performance at low fields is that the radio frequency resonances associated with those lower field strengths are much lower in frequency, that is, a few hundred kilohertz (kHz) to a few megahertz (MHz), and not in the gigahertz (GHz) range of traditional, high field NMR and MRI. Very weak RF signals in the approximately 1 MHz frequency range cannot be detected very effectively with traditional RF pick-up coils. The typical NQR signal is in fact weaker than the thermal noise in the detector circuits.

Atomic magnetometers that have been used for this purpose have been relatively large, and their geometry difficult to miniaturize. Miniature atomic magnetometers have been constructed, which are highly sensitive to direct current (DC) magnetic fields, but are not sensitive to magnetic fields at the radio frequencies relevant for NMR and NQR.

Figure 1A:
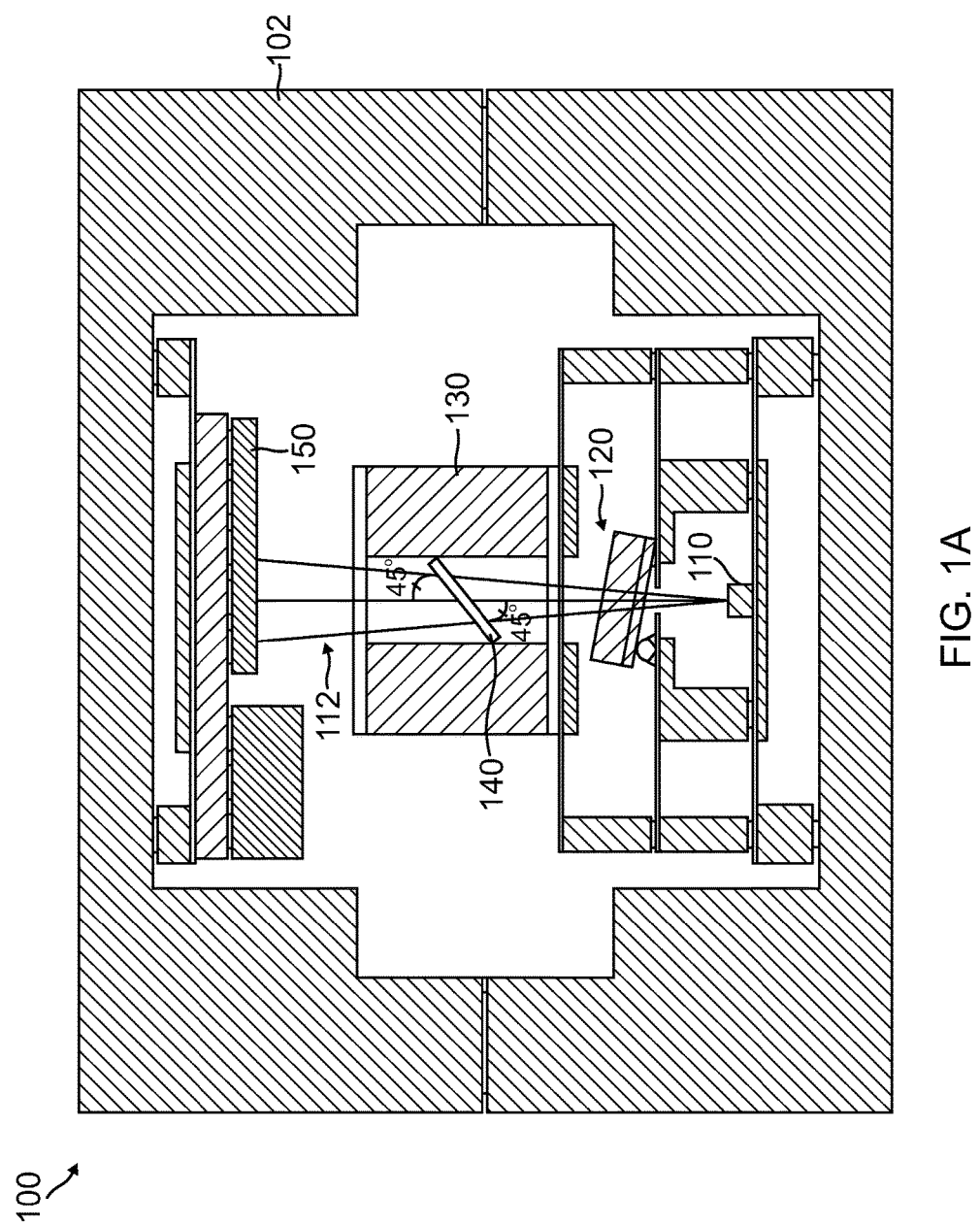
FIG. 1A illustrates a cross sectional view of exemplary embodiments of a single-beam radio frequency atomic magnetometer with an internal DC field coil.

FIG. 1A illustrates a cross sectional view of one embodiment of a single-beam radio frequency magnetometer 100. Single-beam RF magnetometer 100 comprises vacuum package 102 containing laser 110, a quarter wave plate and (if the laser source does not emit light which is sufficiently linearly polarized along the appropriate axis) a linear polarizer 120, a vapor chamber 130, a set of DC field coils 140, and photodetector 150. In one embodiment, laser 110 is a vertical cavity surface emitting laser (VCSEL).

Vapor chamber 130 is configured to sit in the optical path between the laser 110 and photodetector 150 of laser beam 112 emitted by laser 110. Vapor chamber 130 contains a chamber of alkali atoms. In one embodiment, potassium atoms are used in vapor chamber 130. In some embodiments, vapor chamber 130 also includes other gases which act as "buffer" and "quenching" gases as known to those having ordinary skill in the art. These typically include noble gases such as helium or argon, and diatomic molecules such as nitrogen (especially in the role of "quenching gas"). The quarter wave plate and linear polarizer circularly polarizes laser beam 112. Laser beam 112 is configured such that laser beam 112 acts as both a pump beam and probe beam, as known to those having ordinary skill in the art. Therefore, laser beam 112 is a single beam configured to both optically pump and probe the atoms in vapor chamber 130. The set of DC field coils 140 is configured such that when an electrical DC bias is applied, a corresponding DC magnetic field oriented at 45 degrees to the optical axis of laser beam 112 is created in the vapor cell.

During operation, laser 110 is held at a fixed frequency, and modulations on the detector signal induced by the effect of a local RF field on the atoms of vapor chamber 130 are detected. The RF field has the effect of driving transitions among the Zeeman sublevels of the atom.

If the direction of the DC field is defined as the "Z-direction" and the RF magnetic field lies in the Y-Z plane bisecting the angle between the two axes: the Z-component of the RF modulates the DC field $B_0$, and would cause so called "Pi" transitions if any transitions coupled by "Pi"

polarized light were resonant at that frequency. In general, however, no such transitions will be allowed among Zeeman sublevels, and the effect of this component can be ignored.

The Y-component of RF magnetic field, by contrast, is a superposition of left-circularly and right-circularly polarized fields, and will tend to couple the Zeeman sublevels to one another in such a way as to drive, in the absence of decay or pumping Rabi flopping among neighboring levels. During this Rabi flopping process, the magnetic moment would tend to rotate around y axis to x axis and then negative z axis, while spiraling (Larmor precessing) around z.

However, the optical pumping effect of the optical field counteracts this tendency. The result should be a behavior in which the Larmor precession continues, but the Rabi flopping and optical pumping processes reach a steady-state. The exact details of this steady state solution are less important than the fact that the Larmor precession, being driven by the RF field rather than spontaneous, has common phase for all of the atoms. Because of this, it imposes a modulation on the amplitude of the optical field. The absorption of the laser light by the atoms is a function of the orientation of the magnetic moment vector, due to the selection rules for circularly polarized light. In the absence of the RF field, each atom still Larmor precesses individually, but the phases of these precession processes are random, so that there is no net optical signal. The RF is sensed by the phase it imposes on the atoms.

The atoms of vapor chamber 130 are sensitive only to fields at their resonant frequency, but that resonant frequency is tunable depending on the strength of the DC magnetic field induced by DC field coils 140. The strength of the DC magnetic field can be altered by adjusting the electrical DC bias applied to the DC field coils 140. Thus, the DC magnetic field strength can be swept to allow for spectroscopic measurement of the local RF field.

In one embodiment, an excitation pulse may be used to excite a sample to be detected and/or characterized. The excitation pulse is an RF electromagnetic (EM) pulse.

Figure 1B:
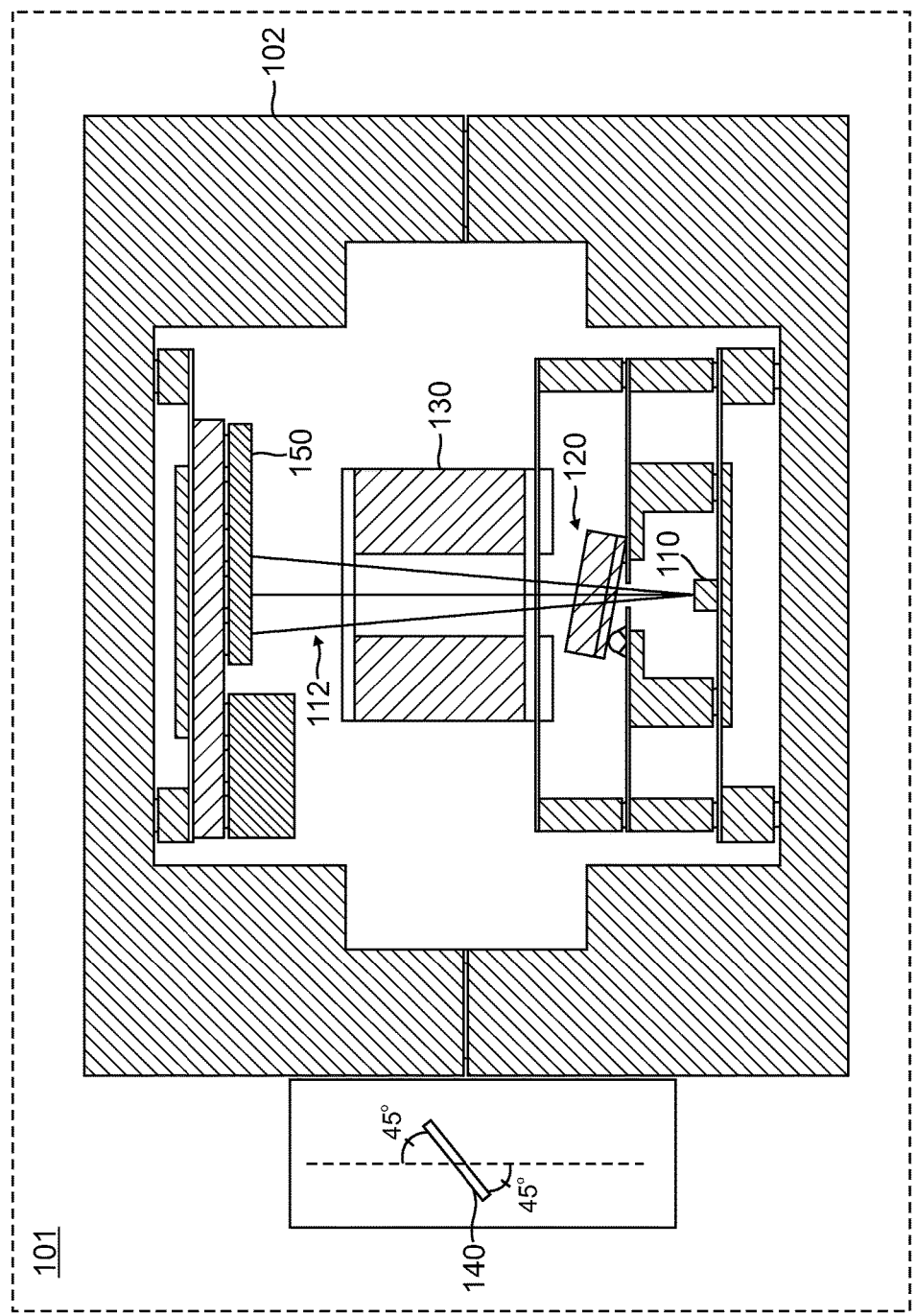
FIG. 1B illustrates a cross sectional view of exemplary embodiments of a single-beam radio frequency atomic magnetometer with an external DC field coil.

FIG. 1B illustrates a side view of an alternative embodiment of a single-beam RF atomic magnetometer 101. This embodiment comprises the same features as described above in FIG. 1A, except the set of DC field coils are located outside of vacuum package 102. The other components and operation of this embodiment of the single-beam RF atomic magnetometer are otherwise identical.

Figure 2:
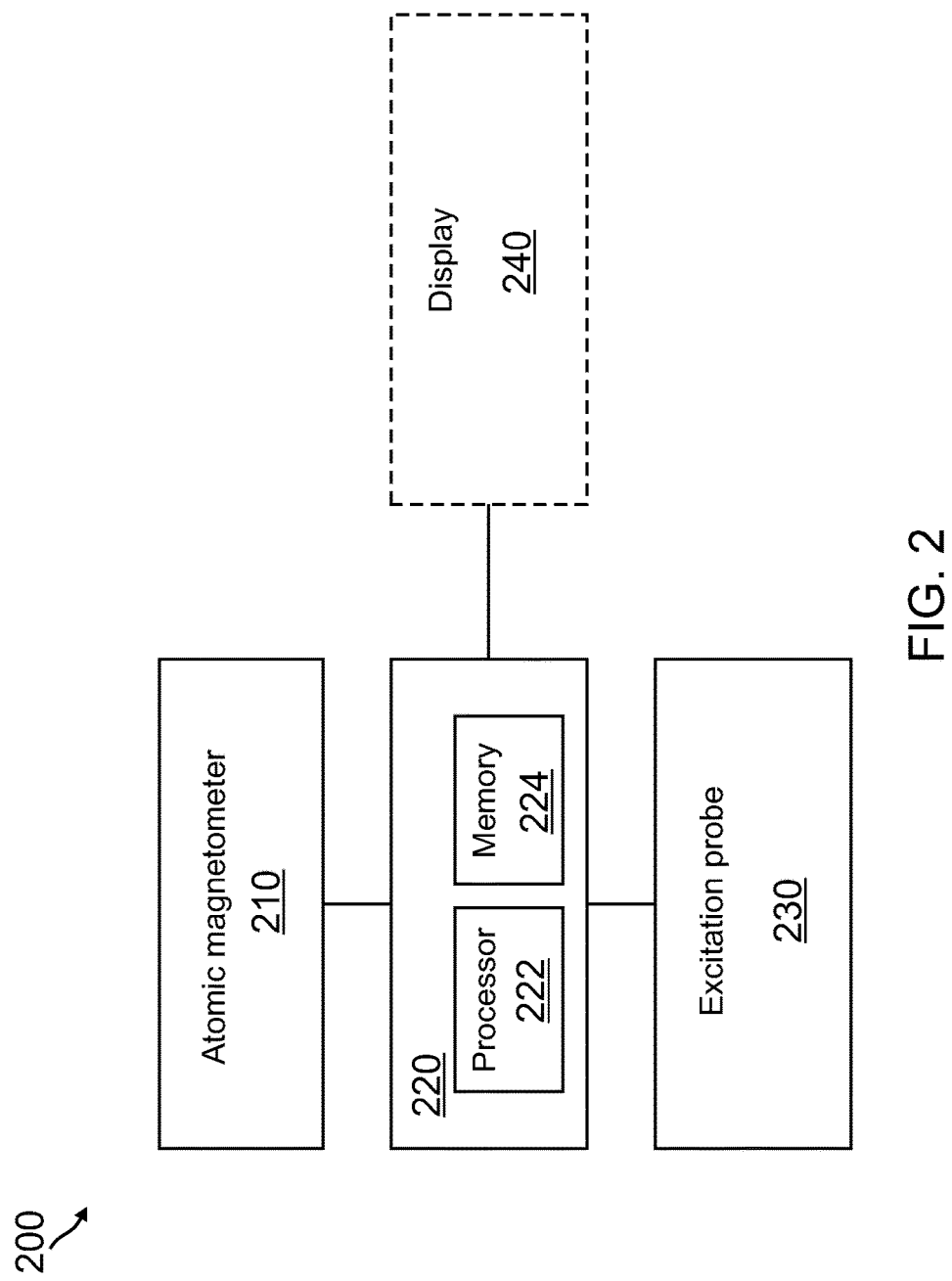
FIG. 2 is a block diagram of an exemplary single-beam radio frequency atomic magnetometer system.

FIG. 2 illustrates an exemplary single-beam RF atomic magnetometer system 200 according to one embodiment. System 200 comprises a single-beam RF magnetic atomic magnetometer 210, comprising a laser, vapor chamber, quarter wave plate and linear polarizer, photodetector, and a set of DC field coils. Single-beam RF magnetic atomic magnetometer 210 is coupled to computation device 220, comprising a microprocessor 222, and system memory 224. System 200 also comprises excitation probe 230. Excitation probe 230 is configured to emit excitation pulses in an NMR-like pulse sequences. Because this excitation pulse will be on resonance for the atoms in the magnetometer, it is advisable, in this application, to detune the magnetometer during excitation by changing the DC field magnitude, and then tune it back to resonance for the expected echo signals by resetting the DC field magnitude. In some embodiments, a frequency range for the excitation pulses may be limited depending on the material to be detected. In other embodiments, a wide range of frequencies may be employed in the excitation pulses. The resonant frequencies in various materials are determined by the atoms themselves, molecular structures and geometries, as well as the local electric field gradient as affected by internal stresses, impurities, and crystal imperfections. Therefore, the frequency spectrum may be tuned for frequencies of various materials, such as explosives or other contraband. The excitation pulse causes the tested sample material to emit an echo pulse. The expected frequency and phase of the echo pulse will be determined by the frequency and phase of the excitation pulse which was applied. This echo pulse causes modulations on the detector signal of the single-beam atomic RF magnetometer 210. In other embodiments, an excitation probe 230 is not used, and the modulation caused by the local RF field of the sample is simply detected by the single-beam RF atomic magnetometer 210.

Analysis device 220 comprises a microprocessor 222, and system memory 224. System memory 224 comprises instructions causing processor 222 to read and analyze the detector signal from atomic magnetometer, demodulate detector with a reference signal derived from the excitation pulse, and determine the sample's resonant frequencies. From this determination, the processor can be configured to identify and characterize the molecular makeup of the sample.

Display 240 is optionally coupled to analysis device 220, and can be configured to display various results of the detection signal analysis conducted above, such as displaying a positive or negative indication, a sample identification or characterization, or other such indication indicative of the results of the signal analysis. The display can be, but is not limited to, a cathode ray tube (CRT) display, an active matrix liquid crystal display (LCD), a passive matrix LCD, light emitting diode (LED) display, or plasma display. It can also be a simple indicator such an LED light signal, or an incandescent light bulb, to indicate a positive or negative result.

Figure 3:
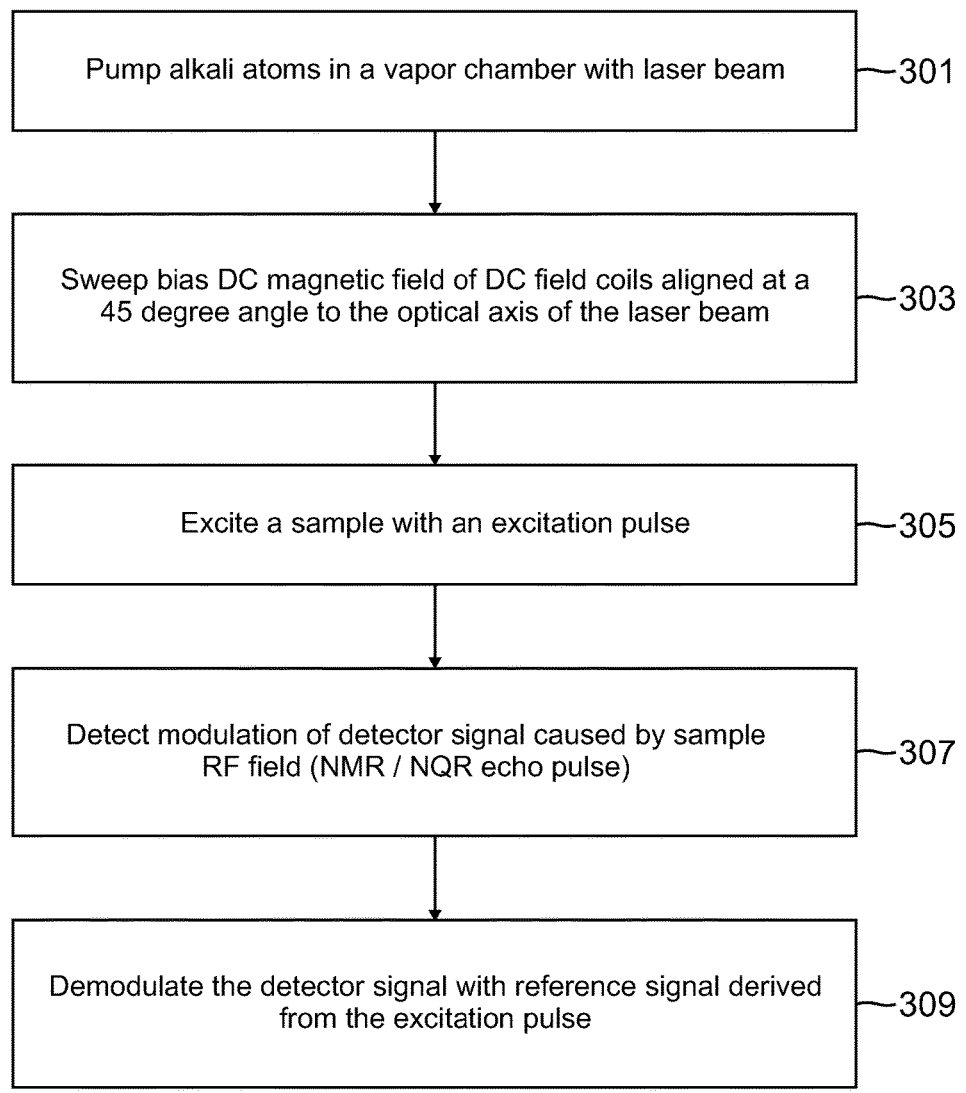
FIG. 3 is a flow chart of an example method of operating a single-beam radio frequency atomic magnetometer system.

FIG. 3 is a flow chart illustrating an example method of operation for a single-beam RF atomic magnetometer in NMR/NQR applications. At block 301, alkali atoms in the vapor chamber of the single-beam RF atomic magnetometer are optically pumped by a circularly polarized laser beam. At block 303, a DC magnetic field is applied to the vapor chamber that contains the optically pumped alkali atoms. The DC magnetic field is generated by a set of DC field coils. The strength of the DC magnetic field applied by the DC field coils is swept. The DC field coils are configured to apply a DC magnetic field aligned at 45 degree angle to the optical axis of the circularly polarized laser beam. The strength of the DC magnetic field can be adjusted by changing the strength of the electrical DC bias on the DC field coils. The strength of the DC magnetic field adjusts the resonant frequency of the pumped alkali atoms in the vapor chamber. At block 305, a sample to be tested is excited with an excitation pulse. In one embodiment, the excitation pulse is generated by an excitation probe external to the atomic magnetometer. The excitation pulse is an RF pulse used to excite the atoms of the sample. The frequency of this excitation pulse may be swept and may encompass a band of frequencies. At block 307, an echo pulse from the sample, generated by excitation of the sample by the excitation pulse, is detected. The expected frequency and phase of the echo pulse will be determined by the frequency and phase of the excitation pulse. Typically, the excitation pulse is less than 5 MHz. The local RF field generated by the sample, in this case the "echo" pulse, induces modulations on the detector signal. In other embodiments, an excitation pulse does not need to be used at all, and instead the single-beam RF atomic magnetometer is configured simply to detect the local RF field generated by other means. At block 309, the modulated signal at the detector can be demodulated with a reference signal derived from the excitation pulse source. Thus, the sample under test can be characterized based on the resonant frequencies of the sample material.

EXAMPLE EMBODIMENTS

Example 1 includes a radio-frequency atomic magnetometer comprising: a laser; a photodetector; a vapor chamber, wherein the vapor chamber is in an optical path of laser light between the laser and photodetector; a circular polarizer configured to circularly polarize laser light emitted by the laser, wherein a circularly polarized laser beam is configured to pump into an oriented state, spins of atoms in the vapor chamber and to probe the atoms of the vapor chamber, wherein probing includes detecting a local radio frequency field; and a set of direct current (DC) field coils comprising at least one DC field coil, wherein the set of DC field coils is configured to generate a DC magnetic field oriented at 45 degrees relative to the optical axis of the laser light emitted by the laser and directed toward the vapor chamber; the set of DC field coils further configured to have adjustable DC magnetic field strength.

Example 2 includes the radio-frequency atomic magnetometer of example 1 further comprising a vacuum package, wherein the set of DC field coils is located inside the vacuum package also containing the laser, photodetector, vapor chamber, and quarter wave plate and linear polarizer.

Example 3 includes the radio-frequency atomic magnetometer of example 1 further comprising a vacuum package, wherein the vacuum package contains the laser, photodetector, vapor chamber, and quarter wave plate and linear polarizer, the set of DC field coils located outside of the vacuum package.

Example 4 includes the radio-frequency atomic magnetometer of any of examples 1-3, wherein the set of DC field coils is configured such that the electrical DC bias applied to the DC field coil can be swept, in turn sweeping the DC magnetic field strength.

Example 5 includes the radio-frequency atomic magnetometer of any of examples 1-4, wherein the vapor chamber comprises a cell containing alkali atoms with the laser light of the laser; wherein the set of DC field coils is configured such that the set of DC field coils exerts a DC magnetic field effect on the alkali atoms of vapor chamber.

Example 6 includes the radio-frequency atomic magnetometer of any of examples 1-5, wherein the circular polarizer comprises a linear polarizer and quarter wave plate.

Example 7 includes the radio frequency atomic magnetometer of any of examples 1-6, wherein the laser light circularly polarized by the circular polarizer is configured as both a pump beam and a probe beam.

Example 8 includes a radio frequency atomic magnetometer system comprising: an atomic magnetometer further comprising: a laser; a photodetector; a vapor chamber, wherein the vapor chamber is in an optical path of laser light between the laser and photodetector; a circular polarizer configured to circularly polarize laser light emitted by the laser, wherein a circularly polarized laser beam is configured to pump into an oriented state, spins of atoms in the vapor chamber and to probe the atoms of the vapor chamber, wherein probing includes detecting a local radio frequency field; and a set of direct current (DC) field coils comprising at least one DC field coil, wherein the set of DC field coils is configured to generate a DC magnetic field oriented at 45 degrees relative to the optical axis of the laser light emitted by the laser and directed toward the vapor chamber; the set of DC field coils further configured to have adjustable DC magnetic field strength; a microprocessor coupled to the atomic magnetometer; a non-transitory computer readable medium; wherein, the computer readable medium is configured to provide instructions to the microprocessor to indicate signals from the atomic magnetometer an excitation probe coupled to the microprocessor configured to produce an excitation pulse.

Example 9 includes the system of example 8 further comprising a display coupled to the microprocessor, the display configured to indicate information about a sample being tested.

Example 10 includes the system of example 9, wherein the display indicates a composition of the sample being tested.

Example 11 includes the system of any of examples 9-10, wherein the display indicates whether or not a specific material is present in the sample being tested.

Example 12 includes the system of any of examples 9-11, wherein the display is any one of an light emitting diode, incandescent light, or other such indicator.

Example 13 includes the system of any of examples 9-11, wherein the display is any of a cathode ray tube (CRT) display, an active matrix liquid crystal display (LCD), a passive matrix LCD, light emitting diode (LED) display, or plasma display.

Example 14 includes the system of any of examples 8-13, wherein the excitation pulse is swept.

Example 15 includes the system of any of examples 8-14, wherein the DC magnetic field strength is swept.

Example 16 includes the system of any of examples 8-15 further comprising a vacuum package, wherein the set of DC field coils is located inside the vacuum package also containing the laser, photodetector, vapor chamber, and quarter wave plate and linear polarizer.

Example 17 includes the system of any of examples 8-15 further comprising a vacuum package, wherein the vacuum package contains the laser, photodetector, vapor chamber, and quarter wave plate and linear polarizer, the set of DC field coils located outside of the vacuum package.

Example 18 includes a method for operating a radio frequency atomic magnetometer comprising: pumping alkali atoms in a vapor chamber with a laser beam; applying a direct current (DC) magnetic field using DC field coils oriented at 45 degrees to an optical axis of the laser beam to the alkali atoms; exciting a sample with an excitation pulse; detecting a modulation of a detector signal caused by an echo pulse, wherein the echo pulse originates from a sample caused by the excitation pulse applied to the sample, wherein the detector signal is a measurement of the laser beam used to pump the alkali atoms in the vapor chamber; demodulating the detector signal with a reference signal derived from the excitation pulse.

Example 19 includes the method of example 18, comprising: detecting a modulation of a detector signal caused by a local radio frequency field, wherein the local radio frequency field originates from the sample; and demodulating the detector signal to detect the local radio frequency field.

Example 20 includes the method of any of examples 18-19, wherein an electrical DC bias of the DC field coils is swept.

What is claimed is:
1. A radio-frequency atomic magnetometer comprising:
a laser;
a photodetector;
a vapor chamber, wherein the vapor chamber is in an optical path of laser light between the laser and photodetector;
a circular polarizer configured to circularly polarize laser light emitted by the laser, wherein a circularly polarized laser beam is configured to pump into an oriented state, spins of atoms in the vapor chamber and to probe the atoms of the vapor chamber, wherein probing includes detecting a local radio frequency field; and a set of direct current (DC) field coils comprising at least one DC field coil, wherein the set of DC field coils is configured to generate a DC magnetic field oriented at 45 degrees relative to the optical axis of the laser light emitted by the laser and directed toward the vapor chamber; the set of DC field coils further configured to sweep the DC magnetic field strength.

2. The radio-frequency atomic magnetometer of claim 1 further comprising a vacuum package, wherein the set of DC field coils is located inside the vacuum package also containing the laser, photodetector, vapor chamber, and quarter wave plate and linear polarizer.

3. The radio-frequency atomic magnetometer of claim 1 further comprising a vacuum package, wherein the vacuum package contains the laser, photodetector, vapor chamber, and quarter wave plate and linear polarizer, the set of DC field coils located outside of the vacuum package.

4. The radio-frequency atomic magnetometer of claim 1, wherein the set of DC field coils is configured such that the electrical DC bias applied to the DC field coil can be swept, in turn sweeping the DC magnetic field strength.

5. The radio-frequency atomic magnetometer of claim 1, wherein the vapor chamber comprises a cell containing alkali atoms capable of coherent population transfer with the laser light of the laser; wherein the set of DC field coils is configured such that the set of DC field coils exerts a DC magnetic field effect on the alkali atoms of vapor chamber.

6. The radio-frequency atomic magnetometer of claim 1, wherein the circular polarizer comprises a linear polarizer and quarter wave plate.

7. The radio frequency atomic magnetometer of claim 1, wherein the laser light circularly polarized by the circular polarizer is configured as both a pump beam and a probe beam.

8. A radio frequency atomic magnetometer system comprising:
an atomic magnetometer further comprising:
a laser;
a photodetector;
a vapor chamber, wherein the vapor chamber is in an optical path of laser light between the laser and photodetector;
a circular polarizer configured to circularly polarize laser light emitted by the laser, wherein a circularly polarized laser beam is configured to pump into an oriented state, spins of atoms in the vapor chamber and to probe the atoms of the vapor chamber, wherein probing includes detecting a local radio frequency field; and
a set of direct current (DC) field coils comprising at least one DC field coil, wherein the set of DC field coils is configured to generate a DC magnetic field oriented at 45 degrees relative to the optical axis of the laser light emitted by the laser and directed toward the vapor chamber; the set of DC field coils further configured to sweep the DC magnetic field strength;
a microprocessor coupled to the atomic magnetometer;
a non-transitory computer readable medium; wherein,
the computer readable medium is configured to provide instructions to the microprocessor to indicate signals from the atomic magnetometer
an excitation probe coupled to the microprocessor configured to produce an excitation pulse.

9. The system of claim 8 further comprising a display coupled to the microprocessor, the display configured to indicate information about a sample being tested.

10. The system of claim 9, wherein the display indicates a composition of the sample being tested.

11. The system of claim 9, wherein the display indicates whether or not a specific material is present in the sample being tested.

12. The system of claim 9, wherein the display is any one of an light emitting diode, incandescent light, or other such indicator.

13. The system of claim 9, wherein the display is any of a cathode ray tube (CRT) display, an active matrix liquid crystal display (LCD), a passive matrix LCD, light emitting diode (LED) display, or plasma display.

14. The system of claim 8, wherein the excitation pulse is swept.

15. The system of claim 8, wherein the set of DC field coils is configured such that the electrical DC bias applied to the DC field coil can be swept, in turn sweeping the DC magnetic field strength.

16. The system of claim 8 further comprising a vacuum package, wherein the set of DC field coils is located inside the vacuum package also containing the laser, photodetector, vapor chamber, and quarter wave plate and linear polarizer.

17. The system of claim 8 further comprising a vacuum package, wherein the vacuum package contains the laser, photodetector, vapor chamber, and quarter wave plate and linear polarizer, the set of DC field coils located outside of the vacuum package.

18. A method for operating a radio frequency atomic magnetometer comprising:
pumping alkali atoms in a vapor chamber with a laser beam;
applying a direct current (DC) magnetic field using DC field coils oriented at 45 degrees to an optical axis of the laser beam to the alkali atoms, wherein the strength of the DC magnetic field applied by the DC field coils is swept;
exciting a sample with an excitation pulse;
detecting a modulation of a detector signal caused by an echo pulse, wherein the echo pulse originates from a sample caused by the excitation pulse applied to the sample, wherein the detector signal is a measurement of the laser beam used to pump the alkali atoms in the vapor chamber;
demodulating the detector signal with a reference signal derived from the excitation pulse.

19. The method of claim 18, comprising:
detecting a modulation of a detector signal caused by a local radio frequency field, wherein the local radio frequency field originates from the sample; and
demodulating the detector signal to detect the local radio frequency field.

20. The method of claim 18, wherein an electrical DC bias of the DC field coils is swept.

* * * * *